United States Patent
Lee et al.

(10) Patent No.: US 6,605,821 B1
(45) Date of Patent: Aug. 12, 2003

(54) PHASE CHANGE MATERIAL ELECTRONIC MEMORY STRUCTURE AND METHOD FOR FORMING

(75) Inventors: Heon Lee, Sunnyvale, CA (US); Dennis Lazaroff, Corvallis, OR (US); Neal Meyer, Corvallis, OR (US); Jim Ellenson, Corvallis, OR (US); Ken Kramer, Corvallis, OR (US); Kurt Ulmer, Corvallis, OR (US); David Pursalan, Corvallis, OR (US); Peter Fricke, Corvallis, OR (US); Andrew Koll, Albany, OR (US); Andy Van Brockin, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/142,494

(22) Filed: May 10, 2002

(51) Int. Cl.$^7$ ................................................ H01L 29/02
(52) U.S. Cl. ....................... 257/2; 257/1; 257/3; 257/4; 439/900
(58) Field of Search ............................ 257/1–5; 438/900

(56) References Cited

U.S. PATENT DOCUMENTS

| | | | |
|---|---|---|---|
| 5,912,839 A | 6/1999 | Ovshinsky et al. | 365/185.03 |
| 5,933,365 A | 8/1999 | Klersy et al. | 365/148 |
| 6,189,582 B1 * | 2/2001 | Reinberg et al. | 143/239 |

* cited by examiner

Primary Examiner—Nathan J. Flynn
Assistant Examiner—Scott R Wilson

(57) ABSTRACT

The invention includes an electronic memory structure. The electronic memory structure includes a substrate. A substantially planar first conductor is formed adjacent to the substrate. An interconnection layer is formed adjacent to the first conductor. A phase change material element is formed adjacent to the interconnection layer. The interconnection layer includes a conductive interconnect structure extending from the first conductor to the phase change material element. The interconnect structure includes a first surface physically connected to the first conductor. The interconnect structure further includes a second surface attached to the phase change material element. The second surface area of the second surface is substantially smaller than a first surface area of the first surface. A substantially planar second conductor is formed adjacent to the phase change material element.

14 Claims, 14 Drawing Sheets

US 6,605,821 B1

PHASE CHANGE MATERIAL ELECTRONIC MEMORY STRUCTURE AND METHOD FOR FORMING

FIELD OF THE INVENTION

The invention relates generally to random access memory (RAM). More particularly, the invention relates to a phase change material electronic memory structure, and a method for forming the phase change material electronic memory structure.

BACKGROUND OF THE INVENTION

RAM can be used in computer systems. Generally, RAM can perform read and write operations much faster than conventional long-term storage such as hard drives. In addition, RAM is generally more compact and generally consumes less power than hard drives.

RAM devices generally include an array of memory cells. The memory cells are typically configured in rows and columns. Each row generally includes a corresponding word line, and each column generally includes a corresponding bit line. FIG. 1 shows an RAM array of memory cells 110, 120, 130, 140, and corresponding word lines (WL) and bit lines (BL). The RAM memory cells 110, 120, 130, 140 are located at cross-points of the word lines and the bit lines, and each RAM memory cells 110, 120, 130, 140 generally stores a bit of information.

The RAM memory cells 110, 120, 130, 140 include functionality for setting the RAM memory cells 110, 120, 130, 140 to one of at least two logical states. Each logical state represents a bit of information. Additionally, the RAM memory cells 110, 120, 130, 140 include functionality for sensing the logical state of each of the RAM memory cells 110, 120, 130, 140.

A particular RAM memory cell structure includes a phase change material. Phase change material memory cells generally include data being stored by setting the phase change material to one of two physical states of the phase change material. For example, a first physical state of the phase change material can include a high electrical resistance state, and a second physical state of the phase change material can include a low electrical resistance state. The first physical state can represent a binary zero, and the second physical state can represent a binary one.

A particular phase change material RAM memory cell can include the first physical state being an amorphous state that includes a high electrical resistance. The phase change material RAM memory cell can further include the second physical state being a crystalline state that includes a low electrical resistance. The electrical resistance of the phase change material RAM memory cell can be determined (that is, read) by sensing the resistance of the phase change material memory cell. The electrical resistance can be sensed by applying a voltage or current across the phase change material memory cell, and sensing a resulting current voltage.

FIG. 2A shows typical voltage signals that can be applied to a phase change material RAM memory cell for setting the resistive state of the memory cell, and therefore, the logical state of the memory cell. A first voltage waveform 210 can be designated as a write signal. The write signal 210 includes a voltage level great enough to cause Joule heating of the phase change material of the memory cell to transform the phase change material to an amorphous state. A second voltage waveform 220 can be designated as an erasing signal. The erasing signal includes a lower voltage that is applied for a longer duration. The erasing signal can transform the phase change material back to a crystalline state.

FIG. 2B shows typical device temperature traces 212, 222 that correspond with the voltage waveforms 210,220 of FIG. 2A. The first voltage waveform 210 generates a first temperature trace 212 that exceeds a melting temperature (designated by line 225) of the phase change material. The second voltage waveform 220 generates a second temperature trace 222 that does not exceed the melting temperature of the phase change material. However, the second temperature traces 222 shows that the temperature of the phase change material is elevated for a longer period of time.

FIG. 3 shows a phase change material RAM memory cell in greater detail. A bit line 310 and a word line 320 are electrically connected to a phase change material memory cell 330. A voltage is applied to the bit line 310 and the word line 320 that causes a current I to flow through the phase change material memory cell 330. Heat is generated that sets the state of the phase change memory cell 330.

A disadvantage of the phase change material memory cell structure of FIG. 3 is that the conductive bit line 310 and the conductive word line 320 each conduct significant amounts of Joule heating away from the phase change material memory cell 330, as is designated by H and the associated arrows of FIG. 3. Therefore, in order for the phase change material memory cell 330 to be heated enough to set a proper physical state, a greater voltage and resulting current must be applied to compensate for the heat conducted away from the phase change memory cell 330 by the conductive bit line 310 and the conductive word line 320, than would be required without the conductive bit line 310 and the conductive word line 320 conducting heat. Generally, applying a greater amount of voltage and current is undesirable because this requires more power to be used by the RAM structure.

Additionally, the heat conduction away from the selected phase change material memory cell 330 can cause neighboring phase change material memory cells to be partially heated. The partial heating can cause the neighboring phase change material memory cells to start to change physical states. This effect is generally referred to as cross-talk, and should be minimized.

It is desirable to have an apparatus and method for a phase change material memory element structure that provide more efficient heating of the phase change material within the phase change material memory element structure. The phase change material memory element structure should be easy to fabricate. The phase change material memory element structure should minimize the effects of cross-talk between neighboring phase change material memory elements within an array of phase change material memory elements.

SUMMARY OF THE INVENTION

The invention includes a phase change material memory element structure, and method of forming, that provides more efficient heating of a phase change material within the phase change material memory element structure. The phase change material memory element structure is easy to fabricate. The phase change material memory element structure minimizes the effects of cross-talk between neighboring phase change material memory elements within an array of phase change material memory elements.

A first embodiment of the invention includes an electronic memory structure. The electronic memory structure includes a substrate. A substantially planar first conductor is formed adjacent to the substrate. An interconnection layer is formed adjacent to the first conductor. A phase change material element is formed adjacent to the interconnection layer. The interconnection layer includes a conductive interconnect structure extending from the first conductor to the phase change material element. The interconnect structure includes a first surface physically connected to the first conductor. The interconnect structure further includes a second surface attached to the phase change material element. The second surface area of the second surface is substantially smaller than a first surface area of the first surface. A substantially planar second conductor is formed adjacent to the phase change material element.

A second embodiment of the invention includes an electronic memory structure. The electronic memory structure includes a substrate, and a substantially planar first conductor formed adjacent to the substrate. An interconnection layer is formed adjacent to the first conductor. A phase change material element is formed adjacent to the interconnection layer. The interconnection layer includes a conductive interconnect structure extending from the first conductor to the phase change material element. The interconnect structure includes a first surface physically connected to the first conductor. The interconnect structure further includes a second surface attached to the phase change material element. The phase change material element includes a phase change surface physically connected to the interconnection layer.

The phase change surface includes a phase change surface area. A minority amount of the phase change surface area is physically connected to the conductive interconnect structure. A substantially planar second conductor is formed adjacent to the phase change material element.

A third embodiment of the invention includes method of forming as electronic memory structure. The method includes depositing a first conductor on a substrate. An interconnection layer insulator is deposited over the first conductor and the substrate. A trench is etched in the interconnection layer insulator down to the first conductor. An interconnection layer conductor is deposited over the trench. A second interconnection layer insulator is deposited over the interconnection layer conductor. The second interconnection layer insulator is polished to expose a portion of the interconnection layer conductor. A phase change material is deposited over a portion of the exposed portion of the interconnection layer conductor. A second conductor is deposited over the phase change material.

Other aspects and advantages of the present invention will become apparent from the following detailed description, taken in conjunction with the accompanying drawings, illustrating by way of example the principles of the invention.

DETAILED DESCRIPTION

Figure 1:
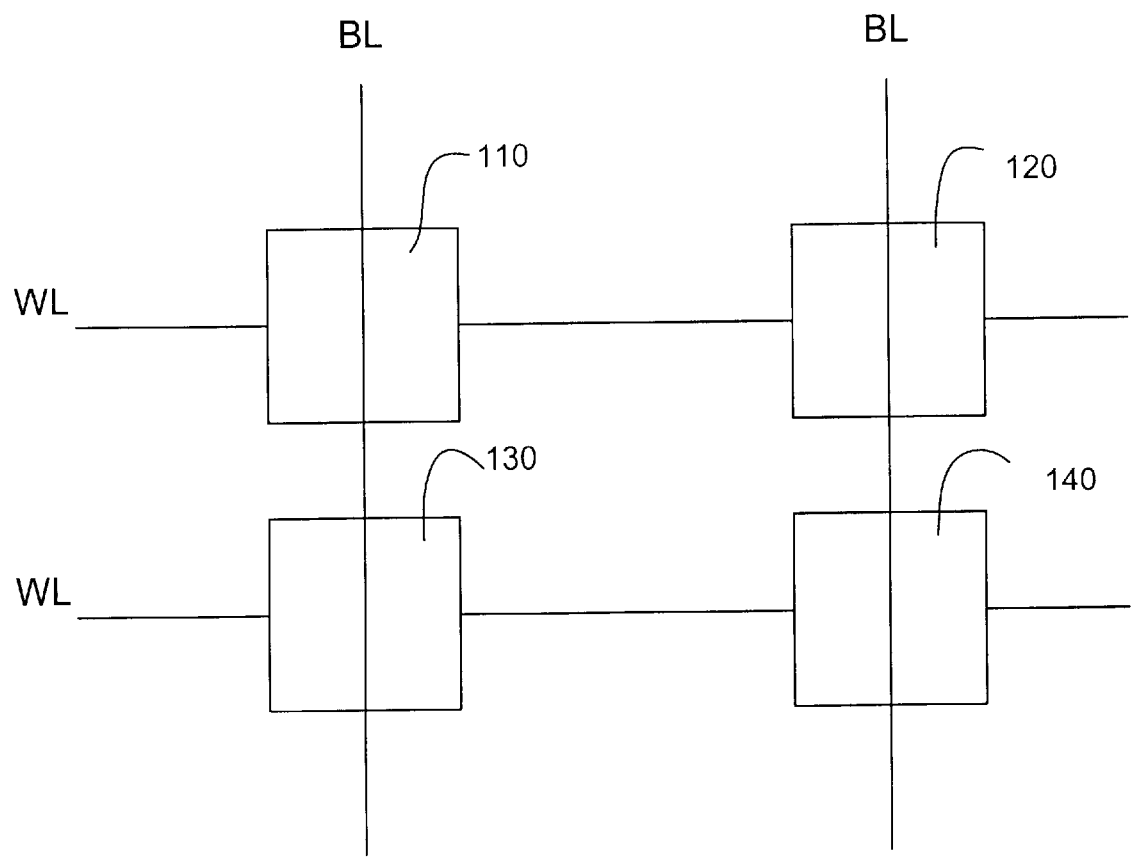
FIG. 1 shows a portion of a typical prior art array of RAM memory cells.
Figure 2A:
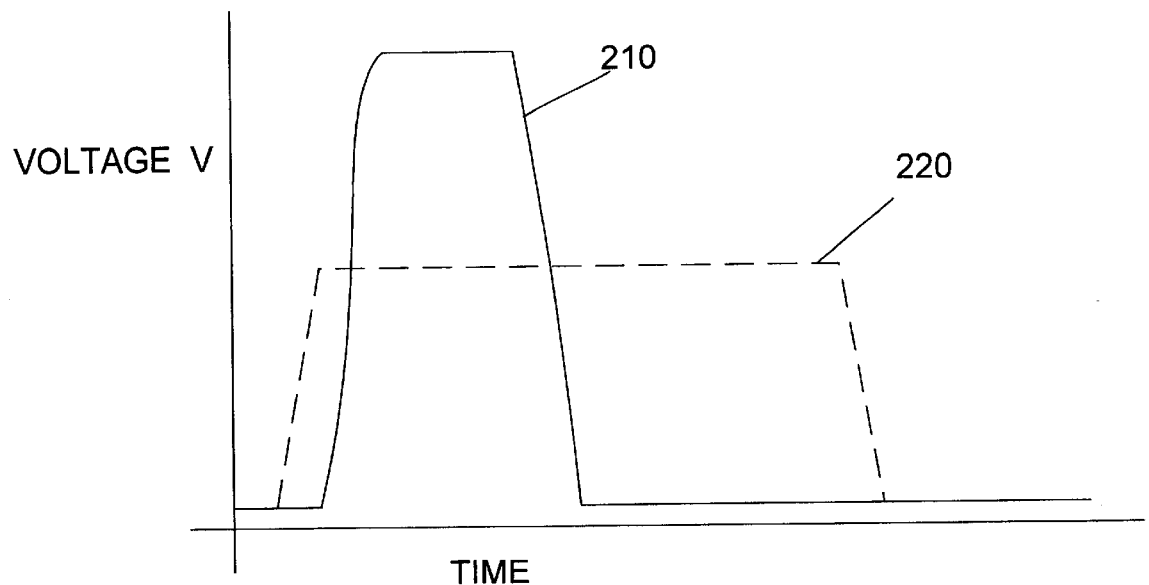
FIG. 2A shows voltage waveforms that are typically applied to phase change material RAM cells for changing a physical state of the RAM cells.
Figure 2B:
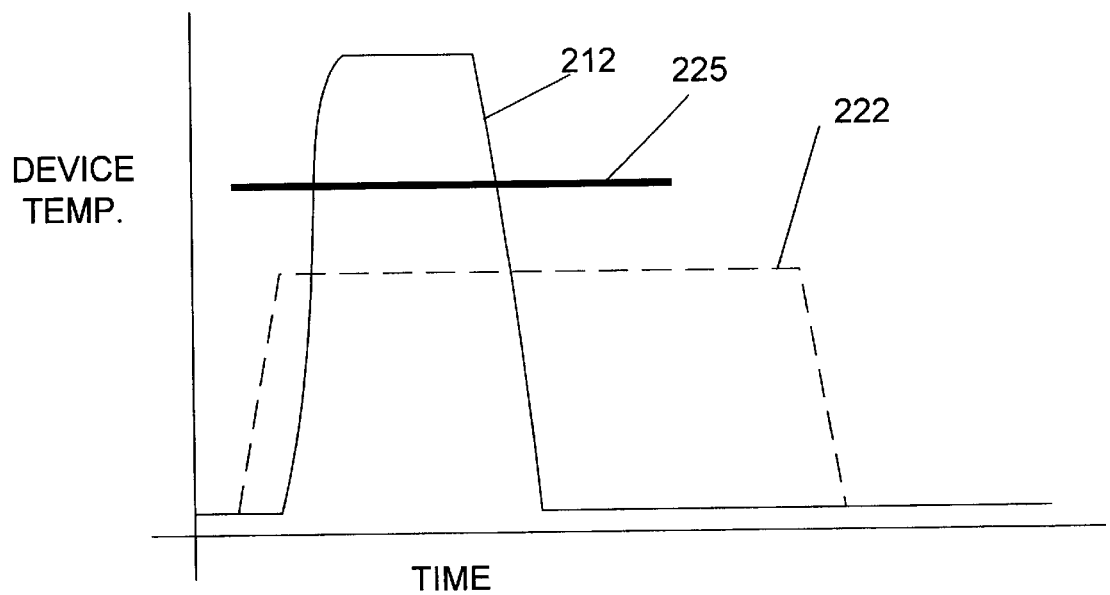
FIG. 2B shows traces corresponding to a temperature of the phase change material of the RAM cells subjected to the voltage waveforms of FIG. 2A.
Figure 3:
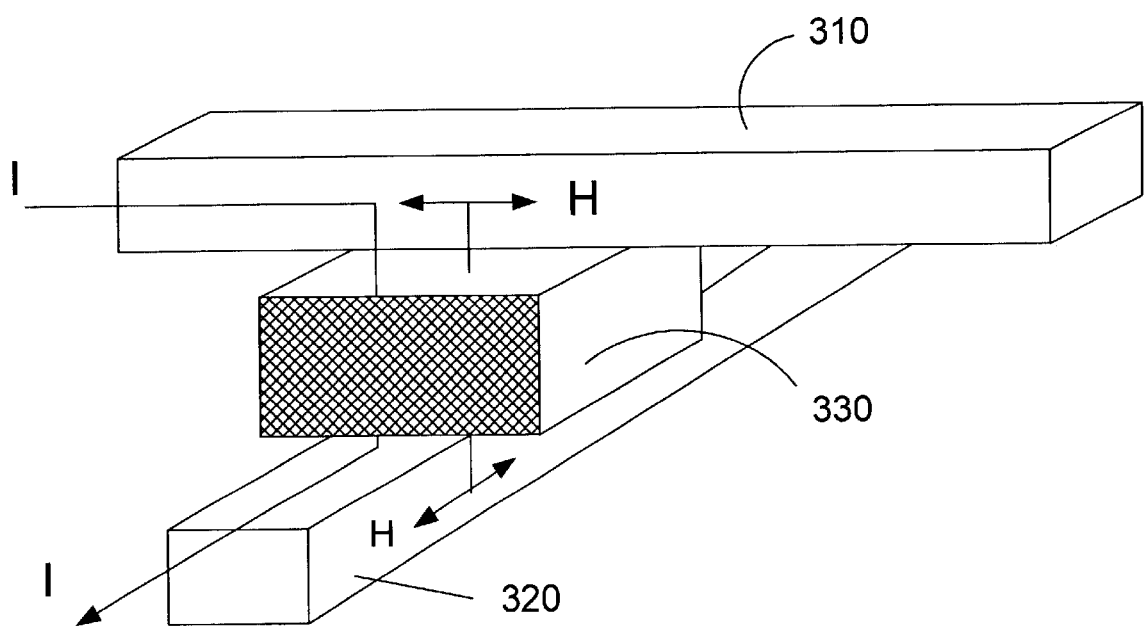
FIG. 3 shows an embodiment of prior art RAM memory cell with greater detail.

As shown in the drawings for purposes of illustration, the invention is embodied in a phase change material memory element structure, and method of forming, that provides more efficient heating of a phase change material within the phase change material memory element structure. The phase change material memory element structure is easy to fabricate. The phase change material memory element structure minimizes the effects of cross-talk between neighboring phase change material memory elements within an array of phase change material memory elements.

Figure 4:
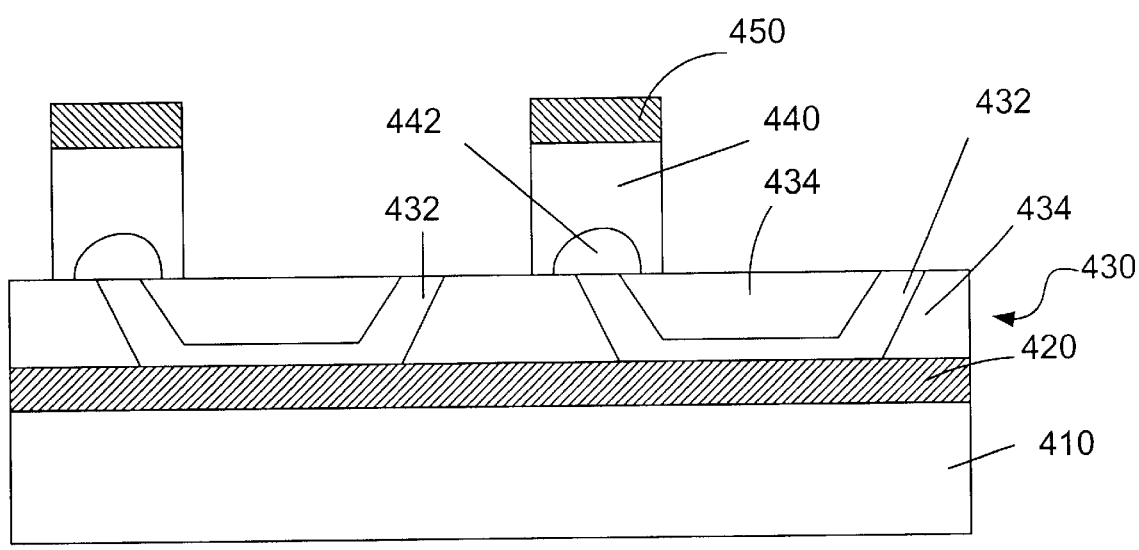
FIG. 4 shows an embodiment of the invention.

FIG. 4 shows an embodiment of the invention. This embodiment includes a substrate 410, a first substantially planar conductive layer 420, an interconnection layer 430, a phase change material layer 440 and a second substantially planar conductive layer 450. The interconnection layer 430 includes a conductive interconnect structure 432 and an insulator 434.

A voltage potential applied between the first conductive layer 420 and the second conductive layer 450 causes current to flow through the first conductive layer 420, the conductive interconnect structure 432, the phase change material layer 440 and the second conductive layer 450. The conducted current causes heat to be generated in the phase change material layer 440, that can cause the phase change material layer 440 to change physical states. A first physical state can include a low resistance state (typically amorphous) and a second physical state can include a high resistance state (typically crystalline). By controlling the voltage and current applied to the first conductive layer 420 and the second conductive layer 450, the physical state (high or low resistance) can be controlled. Generally, the phase change material layer 440 will include a portion 442 of the phase change material layer 440 that is partially altered between one of the two physical states.

The phase change material layer 440 includes several phase change material layer elements 440 in which each element corresponds to a RAM cell. Not shown in FIG. 4, but generally included, is an insulator material between neighboring RAM cells. That is, the insulator material (not shown) is generally located between the phase change material layer elements of neighboring RAM cells.

As previously mentioned, the physical state of the phase change material layer 440 can be determined (read) by applying a voltage or current across the phase change material layer 440 and sensing the resulting current or voltage. Clearly, the applied voltage or current while sensing the physical state of the phase change material layer 440 must be low enough not to change or modify the physical state of the phase change material layer 440. That is, operations to read the state of RAM phase change material layer element must not modify or alter the present physical state of the phase change material layer 440.

As previously mentioned, the first conductive layer 420 and the second conductive layer 450 can act as heat sinks, and therefore, reduce the efficiency of modifications of the physical state of the phase change material layer 440. That is, the first conductive layer 420 and the second conductive layer 450 cause the amount of power applied to the phase change material layer 440 to change the physical state of the phase change material layer 440 to be greater than if the first conductive layer 420 and the second conductive layer 450 did not conduct heat.

The interconnection layer 430 provides thermal isolation between the phase change material layer 440 and the first conductive layer 420. A conductive interconnect structure 432 provides an electrical connection between the first conductive layer 420 and the phase change material layer 440. An insulator 434 is included within the conductive interconnect structures 432, and between separate conductive interconnect structures 432 associated with neighboring phase change material layer elements 440.

Inclusion of the interconnection layer 430 reduces the amount of surface area of the phase change material layer 440 that is physically in contact with electrically and thermally conductive material, such as the first conductive layer 420. Therefore, the phase change material layer 440 can be heated more efficiently.

The first conductive layer 420 is not physically connected to the phase change material layer 440. Therefore, the first conductive layer 420 does not conduct nearly as much heat away from the phase change material layer 440 as it would if the first conductive layer 420 was flush with the phase change material layer 440.

The first conductive layer 420 is formed proximate to the substrate 410. Proximate formation can include the first conductive layer 420 being formed directly adjacent to the substrate 410, or can include the first conductive layer 420 being separated from the substrate enough to allow for the formation of vertically oriented devices that are not directly adjacent to the substrate 410.

Cross-talk with neighboring phase change material RAM cells is minimized because the first conductive layer 420 and the second conductive layer 450 do not conduct heat away from one phase change material layer element 440 to another phase change material layer element 440.

As will be described later, the conductive interconnect structure 432 of the interconnection layer 430 can be formed by etching trenches in the interconnection layer 430. A conductor is formed at the edges of the trenches. The conductor forms the conductive interconnect structure 432.

Figure 5:
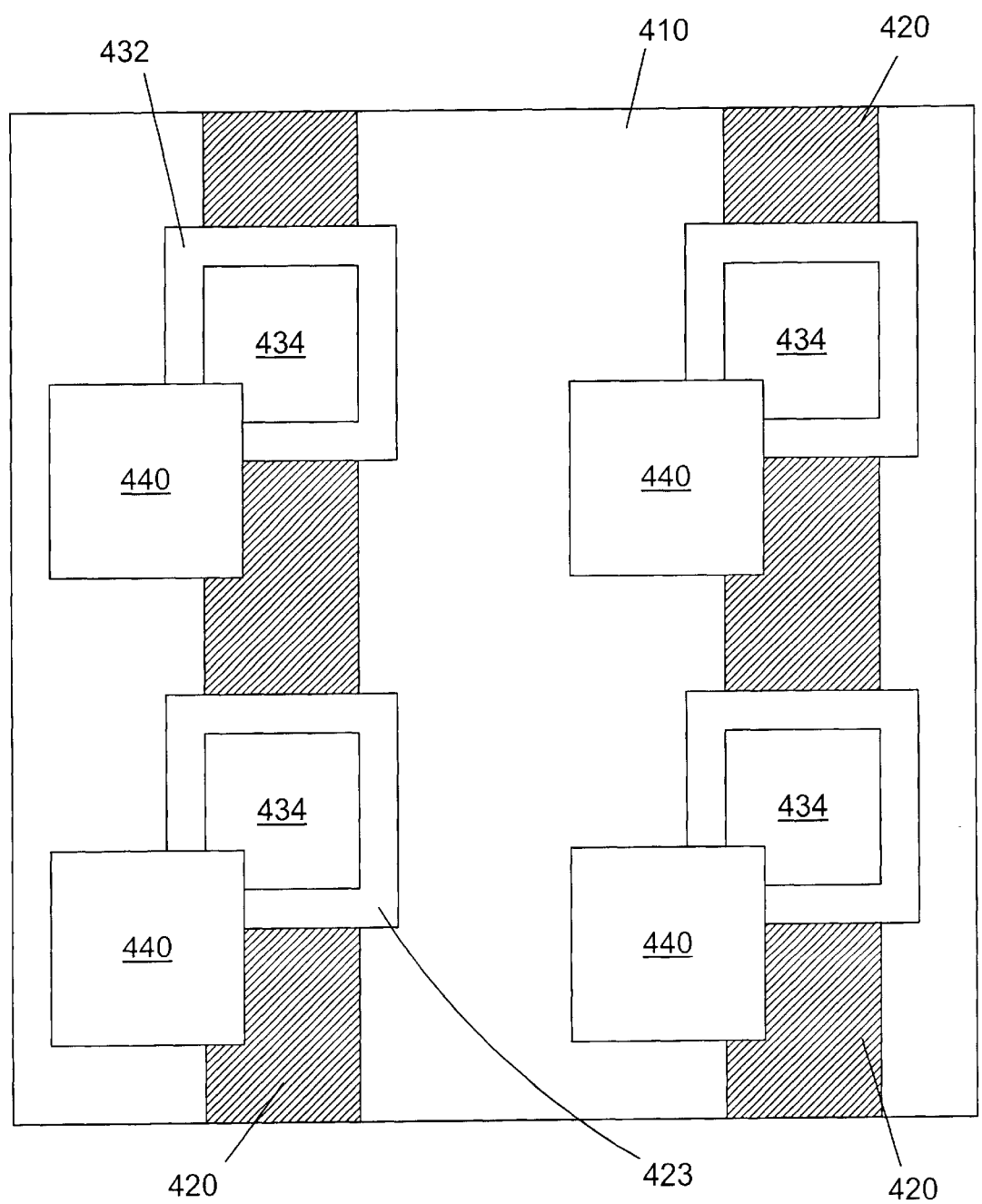
FIG. 5 shows the embodiment of FIG. 4 from a different perspective.

FIG. 5 shows the embodiment of FIG. 4 from a different perspective. More specifically, FIG. 5 is a top view of an embodiment of the invention. The second substantially planar conductive layer 450 is not shown so that the rest of the embodiment can be more clearly depicted.

Generally, the first substantially planar conductive layer 420 is patterned to form either conductive word lines or conductive bit lines. The second substantially planar conductive layer 450 (not shown in FIG. 5) is generally patterned to form either conductive word lines or conductive bit lines. Each RAM element of an array can be selected by the first substantially planar conductive layer 420 and the second substantially planar conductive layer 450.

An embodiment includes the second substantially planar conductive layer 450 being physically and electrically connected to each of the phase change material layer elements 440. The first substantially planar conductive layer 420 can be electrically connected to each of the phase change material layer elements 440 through the conductive interconnect structure 432 of the interconnection layer 430.

As previously mentioned, the interconnection layer 430 generally includes an insulator 434, and the conductive interconnect structure 432 that extends through the insulator 434 electrically connecting the first substantially planar conductive layer 420 to the phase change material layer elements 440. The insulator 434 is shown in FIG. 5 to show that an embodiment includes only outer corners of conductive interconnect structure 432 being physically and electrically connected to the phase change material layer elements 440.

The embodiment of FIG. 5 includes square-shaped trenches formed in the insulator 434 of the interconnection layer 430. The conductive interconnect structure 432 is formed over the edges of the trench. Additional insulator 434 is deposited over the conductive interconnect structure 432. The result is that only the outer edges of the square-shaped trenches are conductive, and provide an electrical connection between the first substantially conductive layer and the phase change material layer elements 440.

The thickness of the conductive interconnect structure 432 can be controlled during formation of the interconnection layer 430. The amount of surface area of the conductive interconnect structure 432 that is physically connected to the phase change material layer elements 440 can be controlled by controlling the thickness of the conductive interconnect structure 432, and the placement of the phase change material layer elements 440 over the conductive interconnect structure 432.

The reduced contact area between the phase change material layer elements 440 and the first substantially planar conductive layer 420 (that is, through the conductive interconnect structure 432) addresses previously mentioned disadvantages of the prior art. A smaller percentage of area of the phase change material layer elements 440 is in contact with a conductor. Therefore, heat loss and thermal cross-talk are reduced. The reduction in heat loss enables a reduction in the amount of drive current required to crystallize the phase change material layer elements 440.

The substrate 400 can be formed from Silicon, a Silicon Oxide, an Aluminum Oxide, a Magnesium Oxide, or other types of well-known ceramics. However, this list in not an exhaustive list. Other materials can be used to form the substrate 400.

The first substantially planar conductive layer 420 can be formed from Copper, Aluminum, Tungsten or alloys thereof. However, this list in not an exhaustive list. Other materials can be used to form the first substantially planar conductive layer 420.

The conductive interconnect structure 432 of the interconnect layer 430 can be formed from Molybdenum, Tungsten, Aluminum, Titanium, Copper, Nickel or alloys thereof. The conductive interconnect structure 432 can also be formed from Tantalum-Silicon-Nickel. This is not an exhaustive list. Other materials can be used to form the conductive interconnect structure 432.

The insulator layer 434 of the interconnect layer 430 can be formed from Silicon oxides, Boron Phosphorous Silicate Glass, Boron Silicate Glass or Phosphorous Silicate Glass. However, this list in not an exhaustive list. Other materials can be used to form the insulator layer 434.

The phase change material elements 440 can be formed from a group of elements selected from Te, Se, Ge, Sb, Bi, Pb, Sn, As, S. The formation of phase change materials in well-know in the field of material science.

The second substantially planar conductive layer 450 can be formed from Copper, Aluminum, Tungsten or alloys thereof. However, this list in not an exhaustive list. Other materials can be used to form the second substantially planar conductive layer 450.

FIG. 6 through FIG. 23 show acts included within formation of an embodiment of the invention.

Figure 6:
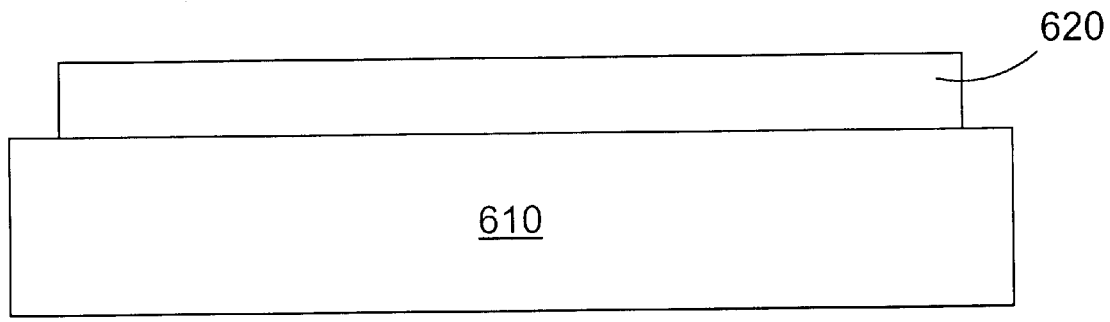
FIG. 6 through FIG. 23 show processing steps included within formation of an embodiment of the invention.

FIG. 6 shows a substrate 610 with a first substantially planar conductive layer 620 deposited over the substrate 610. The first substantially planar conductive layer 620 can be deposited by a chemical vapor deposition (CVD) process. As previously mentioned, the substrate can be formed from Silicon, a Silicon Oxide, an Aluminum Oxide, Glass, a Magnesium Oxide, or other types of well-known ceramics. The first substantially planar conductive layer 620 can be formed from Copper, Aluminum, Tungsten or alloys thereof.

Figure 7:
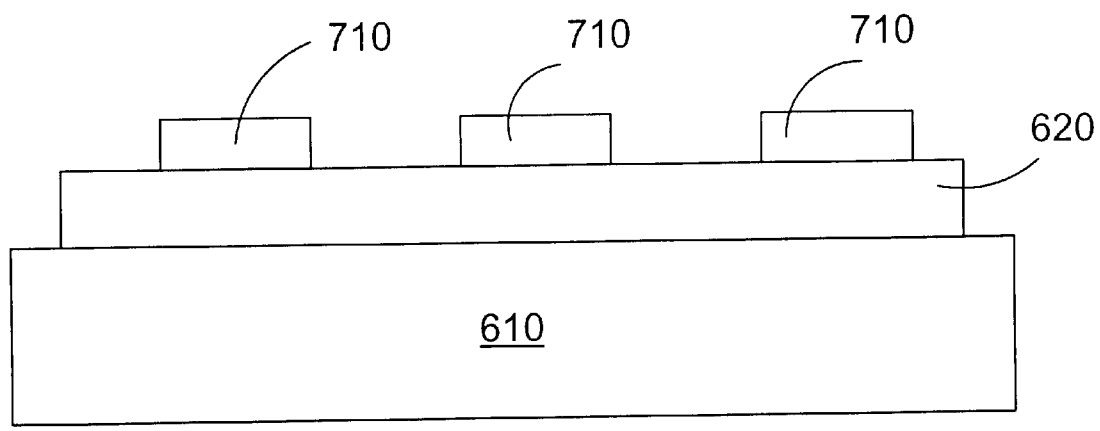

FIG. 7 shows a layer of photo-resist 710 that has been deposited and patterned over the first substantially planar conductive layer 620. The pattern enables formation of the bit lines or word lines within the first substantially planar conductive layer 620.

Figure 8:
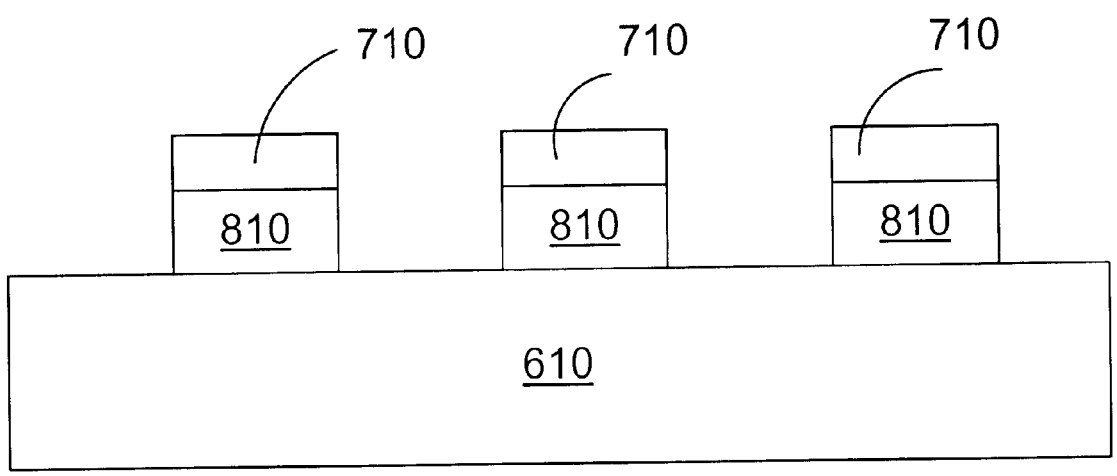

FIG. 8 shows a patterned first substantially planar conductive layer 810 having been etched forming a pattern within the first substantially planar conductive layer 620 according to the pattern of the layer of photo-resist 710. Patterning of conductive layers is known in the art of semiconductor processing.

Figure 9:
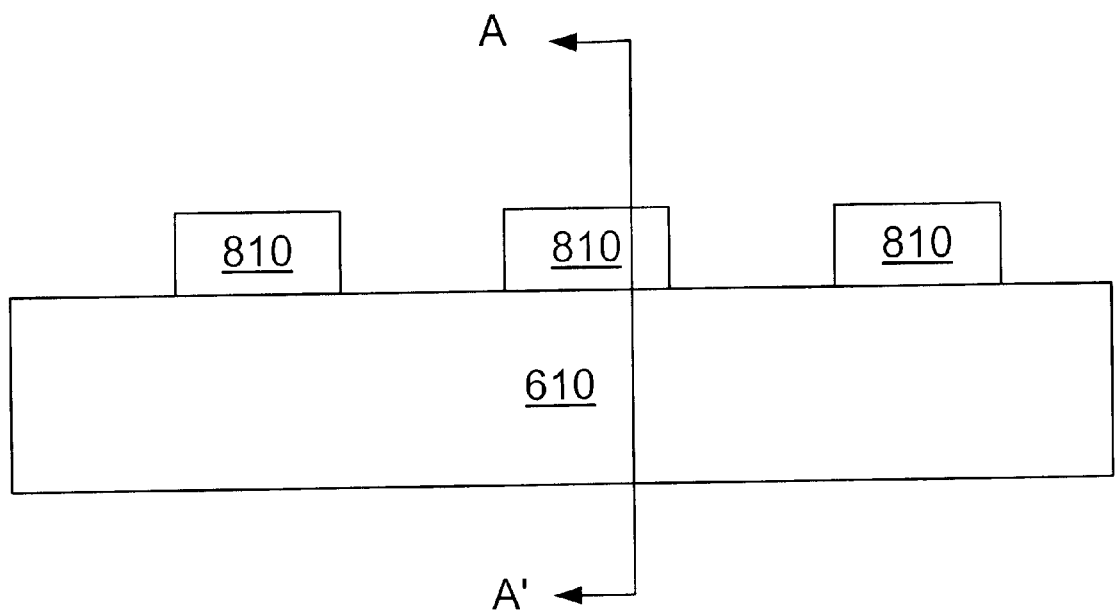

FIG. 9 shows the photo-resist layer 710 having been removed leaving only the patterned first substantially planar conductive layer 810. The photo-resist can be removed through an etching process. A cross-sectional line A–A' is depicted in FIG. 9 which will be used in the subsequent figures.

Figure 10:
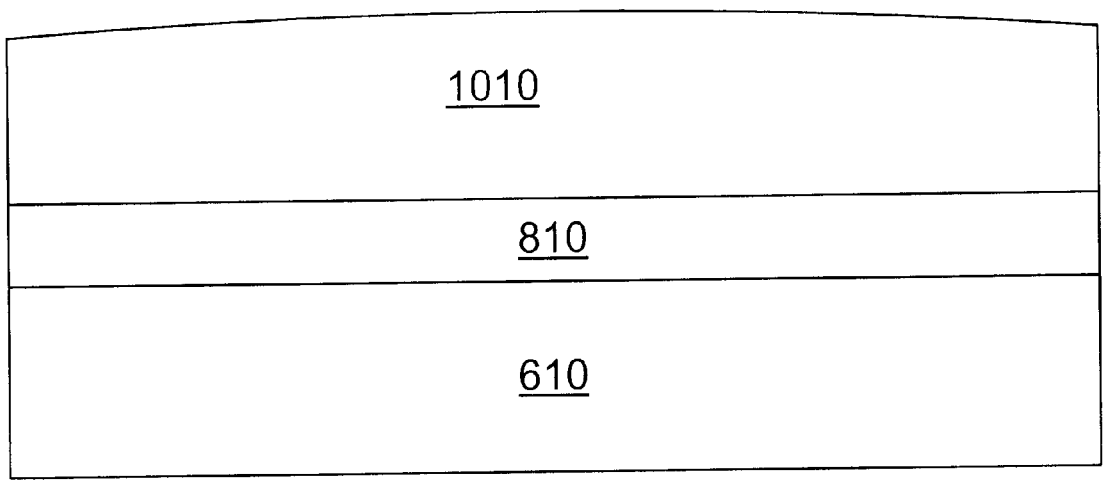

FIG. 10 is an A–A' cross-sectional view of FIG. 9, in which an insulating dielectric layer 1010 has been deposited over the patterned first substantially planar conductive layer 810. As previously mentioned, the insulating dielectric layer 1010 can be formed from Silicon oxides, Boron Phosphorous Silicate Glass, Boron Silicate Glass or Phosphorous Silicate Glass.

Figure 11:
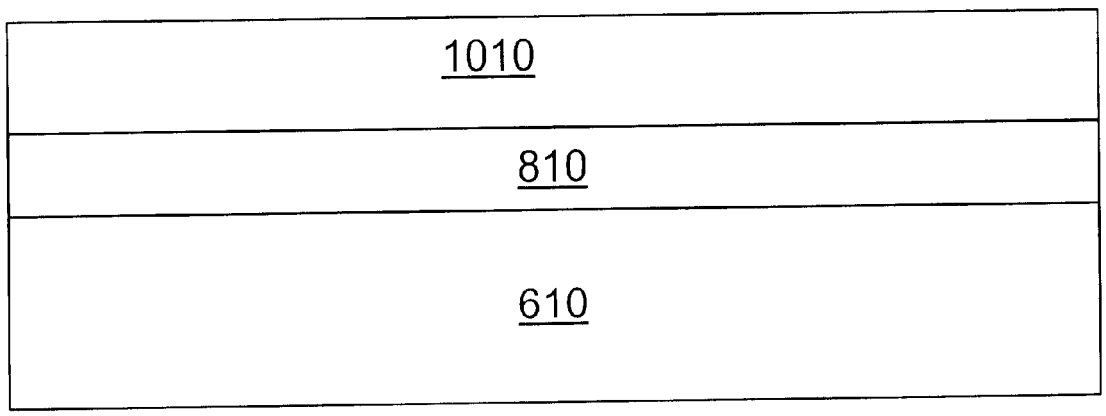

FIG. 11 shows the insulating dielectric layer 1010 having been polished to be substantially planar. A chemical mechanical polishing (CMP) process can be used to polish the insulating dielectric layer 1010.

Figure 12:
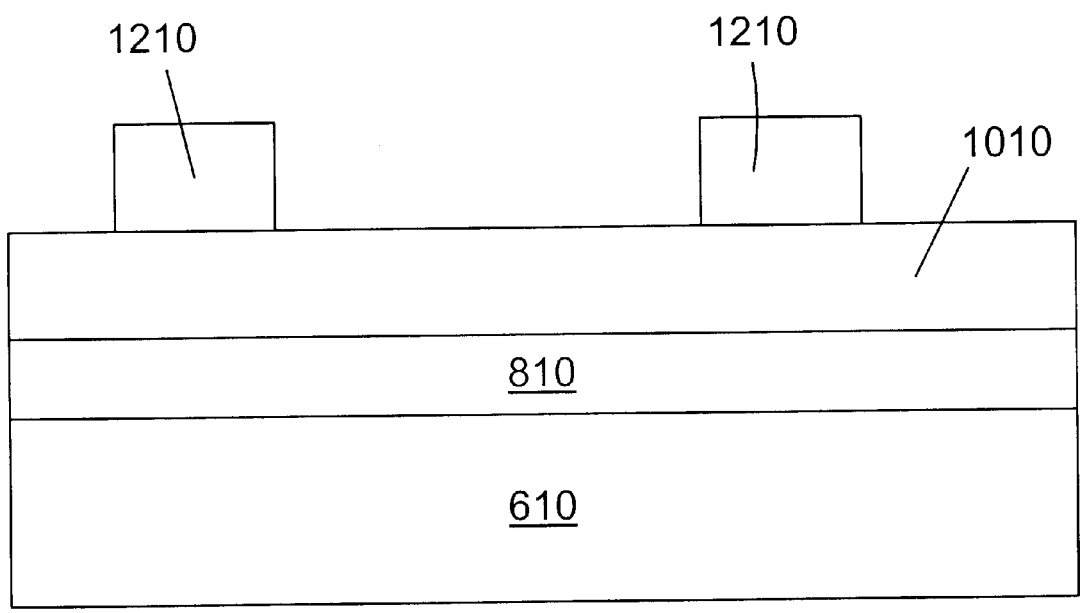

FIG. 12 shows a lithographic patterned photo-resist 1210 having been deposited over the polished insulating dielectric layer 1010. The pattern determines the shape and location of the previously described trenches. The trenches allow formation of the previously described conductive interconnect structure 432.

Figure 13:
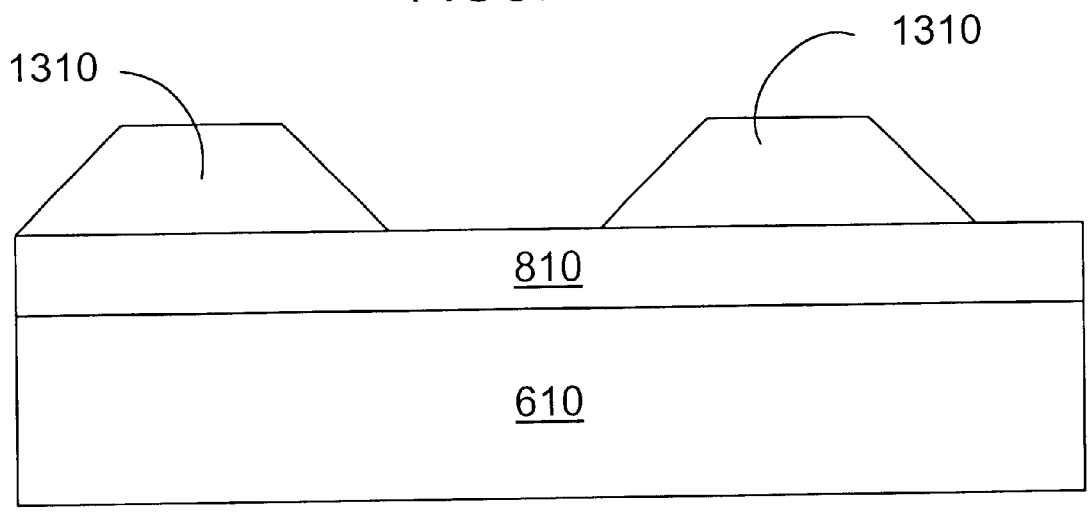

FIG. 13 shows a patterned insulating dielectric layer 1310. The removal of the insulating dielectric providing formation of the trenches, can include an oxide etch. The etching process can be adjusted to allow formation of sloped-edged trenches. The lithographic patterned photo-resist 1210 can be removed through a photo-resist ashing process.

Figure 14:
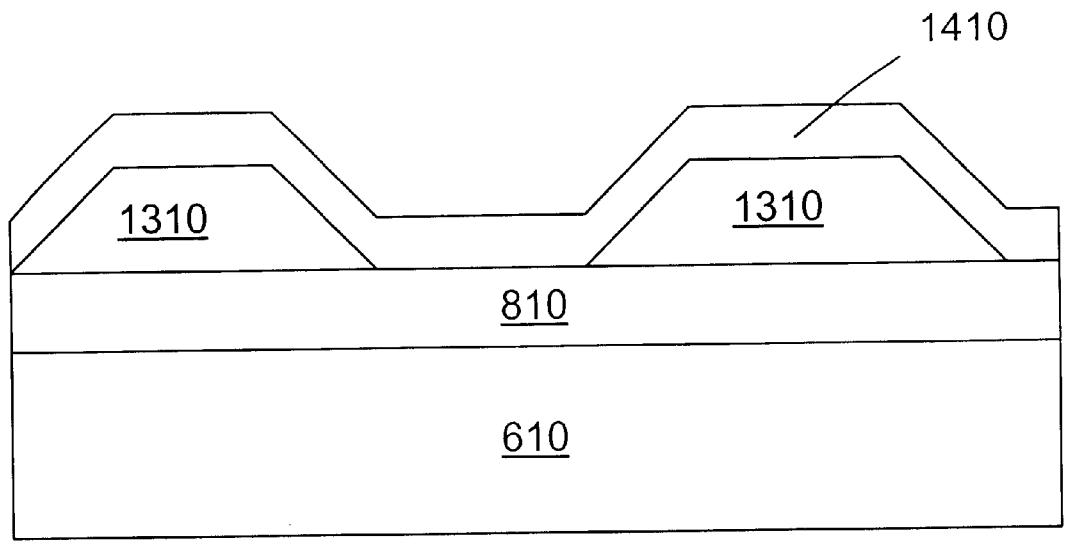

FIG. 14 shows a conductive layer 1410 having been deposited over the patterned insulating dielectric layer 1310. The conductive layer 1410 can be deposited through a conformal metal conductor deposition process. The deposition process can be a CVD process. As previously mentioned, the conductive layer 1410 can be formed from Molybdenum, Tungsten, Aluminum, Titanium, Copper or alloys thereof.

Figure 15:
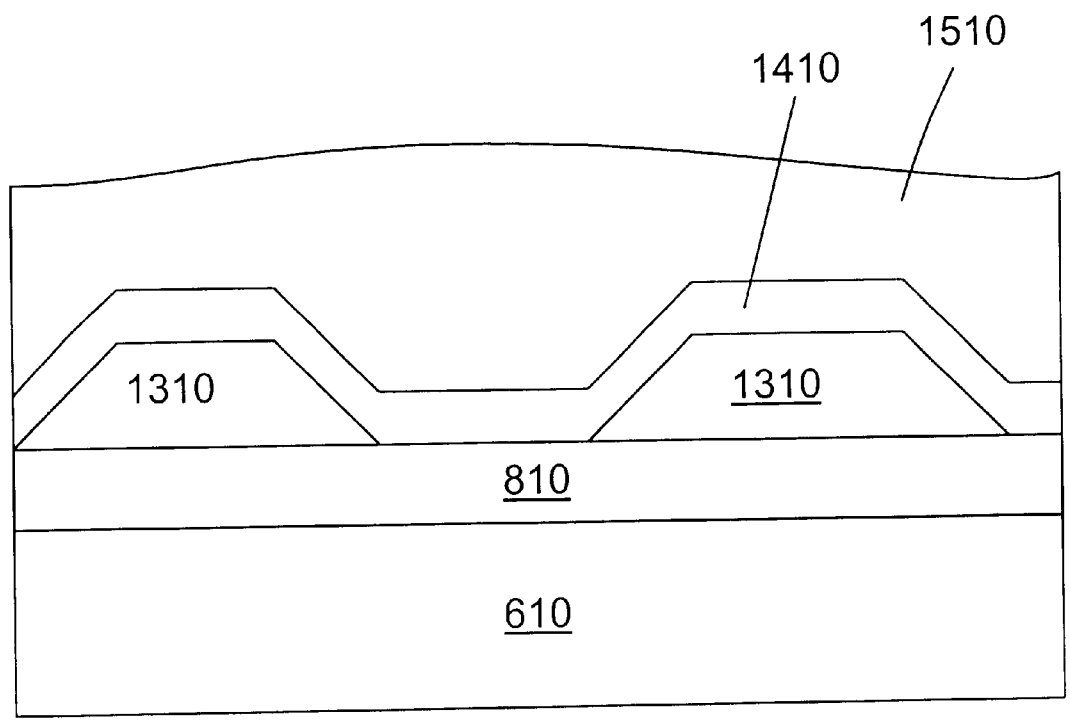

FIG. 15 shows another insulator layer 1510 having been deposited. This can include an oxide deposition process. A CVD process can be used to deposit the insulator layer 1510.

Figure 16:
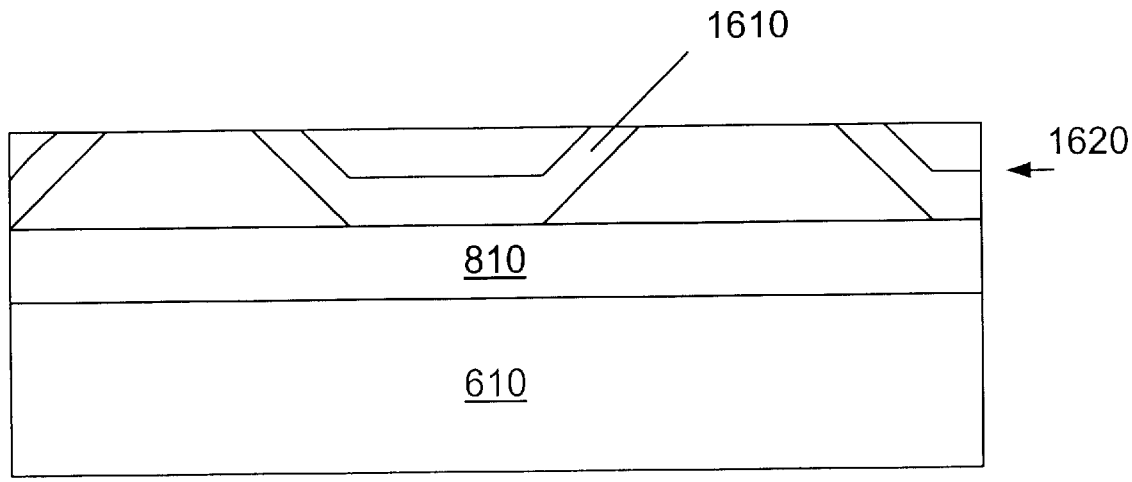

FIG. 16 shows the insulator layer 1510 and the conductive layer 1410 having been polished forming the conductive interconnect structure 1610 within the interconnection layer 1620. The phase change material elements can now be formed over the interconnection layer 1620. The polishing can be performed by a CMP process.

Figure 17:
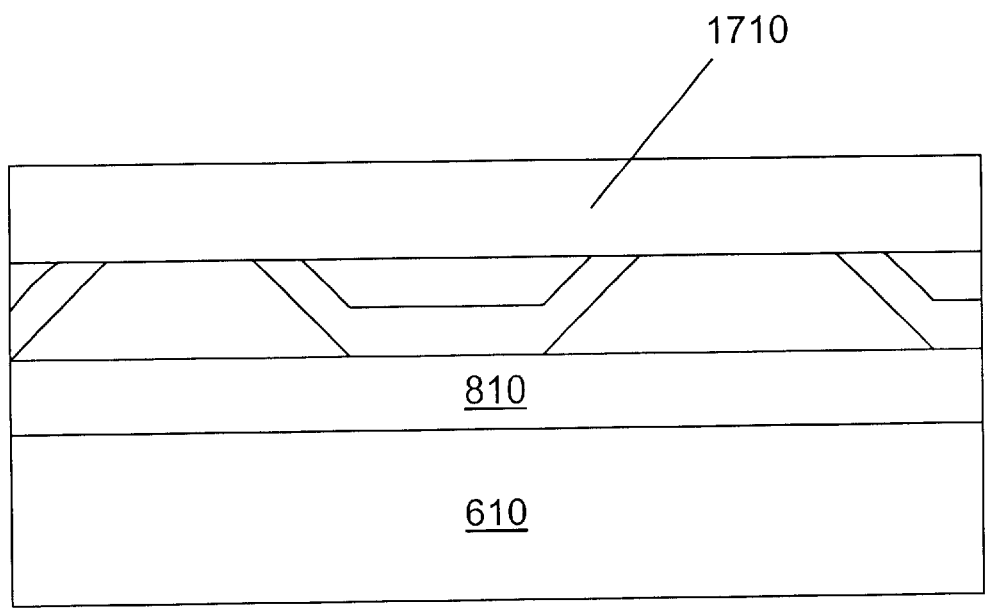

FIG. 17 shows a phase change material layer 1710 deposited over the interconnection layer 1620. The phase change material layer 1710 can be formed from a group of elements selected from Te, Se, Ge, Sb, Bi, Pb, Sn, As, S. A CVD process can be used to deposit the phase change material layer 1710.

Figure 18:
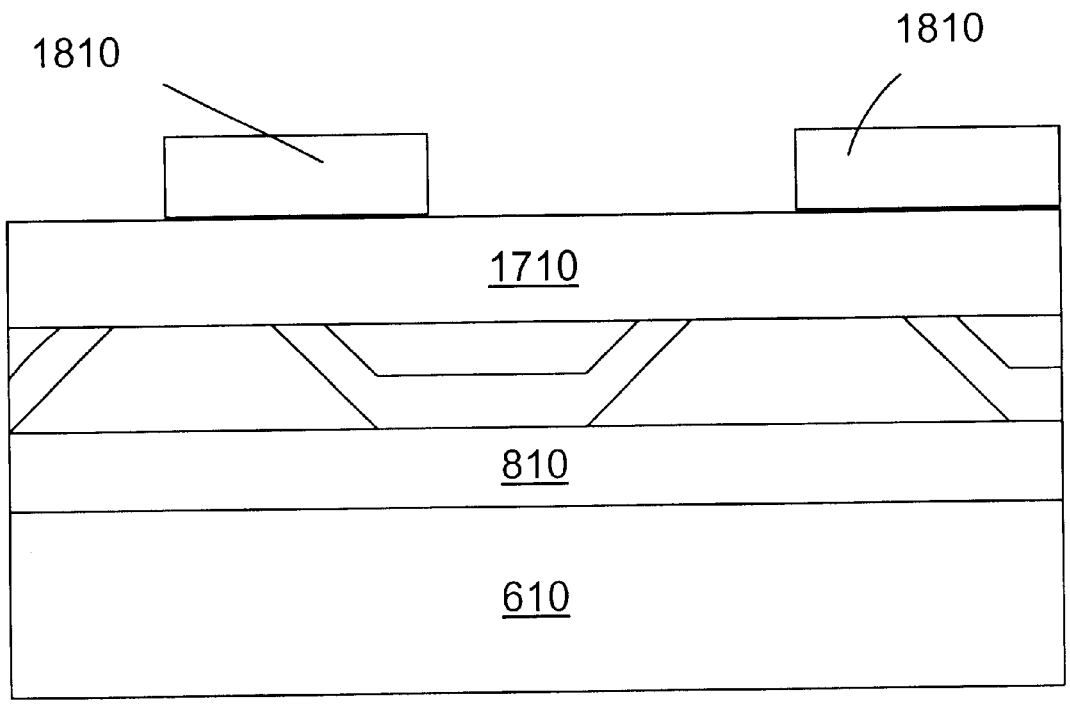

FIG. 18 shows a lithographic patterned photo-resist layer 1810 deposited over the phase change material layer 1710. The pattern determined the eventual pattern of the phase change material layer elements included within individual RAM memory elements.

Figure 19:
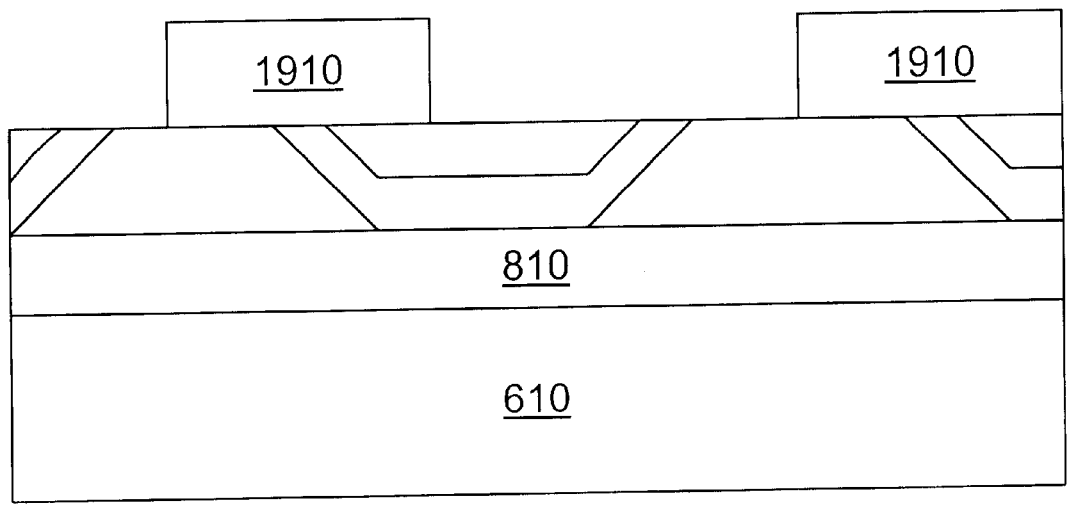

FIG. 19 shows the phase change material layer 1710 having been etched and the photo-resist layer 1810 having been removed. Phase change material elements 1910 are left behind.

Figure 20:
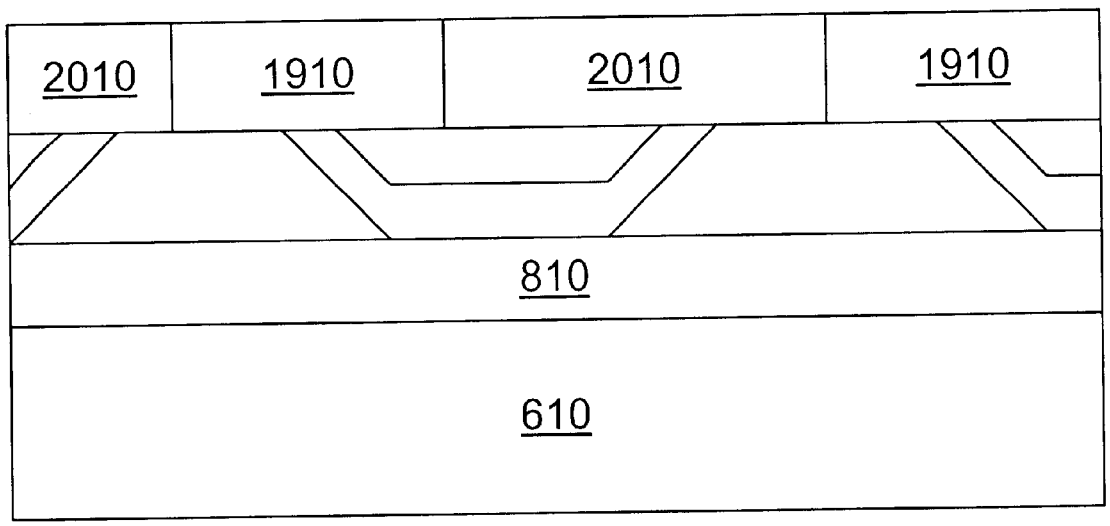

FIG. 20 shows an insulating layer 2010 having been deposited over the phase change material elements 1910, and the insulating layer 2010 having been polished. The insulating layer can be deposited through a CVD process and polished through a CMP process.

Figure 21:
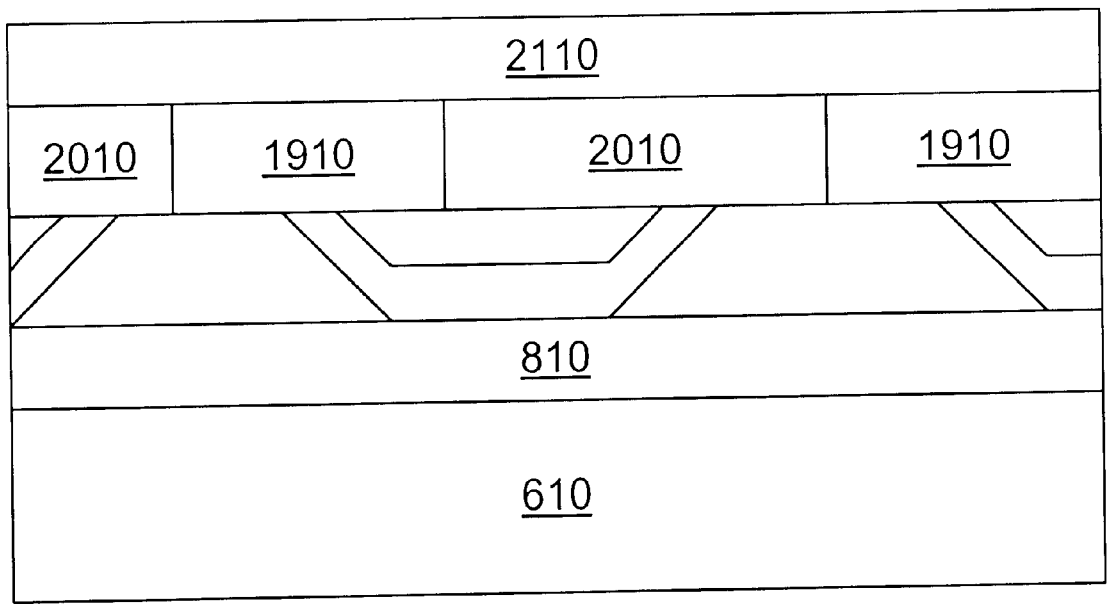

FIG. 21 shows the second substantially planar conductive layer 2110 having been deposited over the insulating layer 2010 and the phase change material elements 1910.

Figure 22:
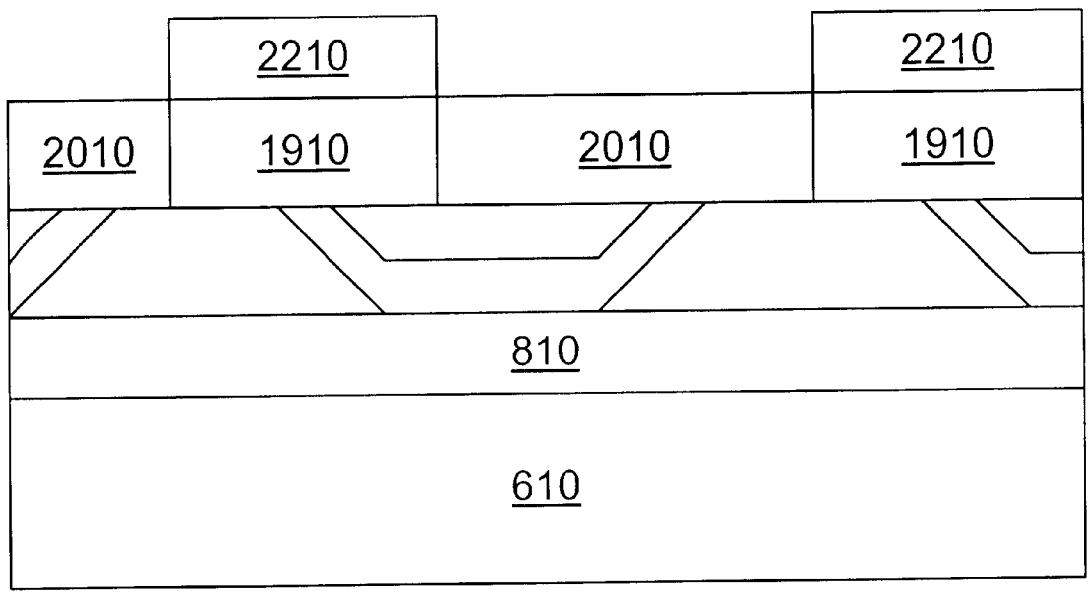

FIG. 22 shows the second substantially planar conductive layer 2110 having been patterned forming an array of conductive bit lines or word lines. A patterned second substantially planar conductive layer 2210 can be obtained by depositing a lithographic patterned photo-resist, etching the second substantially planar conductive layer 2110 and removing the patterned photo-resists.

Figure 23:
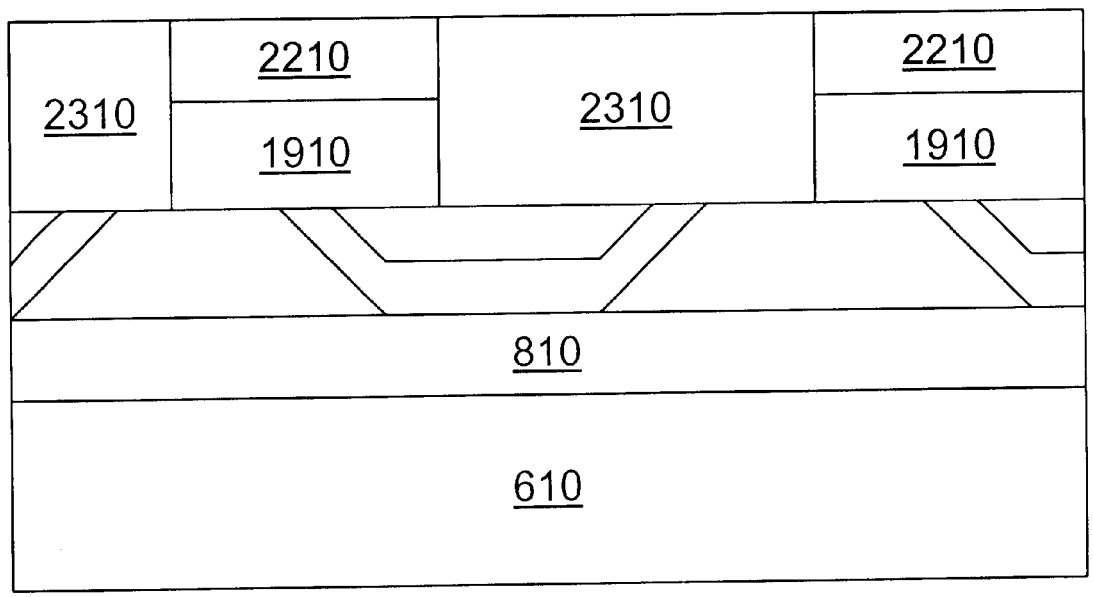

FIG. 23 shows another insulting layer having been deposited and polished. As previously done, the insulating layer can be depositing through a CVD process, and polished through a CMP process. This new insulating layer bond with the old insulating layer 2010 to form a new insulating layer 2310.

Although specific embodiments of the invention have been described and illustrated, the invention is not to be limited to the specific forms or arrangements of parts so described and illustrated. The invention is limited only by the appended claims.

What is claimed is:

1. An electronic memory structure comprising:

a substrate;

a substantially planar first conductor formed proximate to the substrate;

an interconnection layer formed adjacent to the first conductor;

a phase change material element formed adjacent to the interconnection layer;

the interconnection layer comprising:

a conductive interconnect structure extending from the first conductor to the phase change material element, the interconnect structure having a first surface physically connected to the first conductor, the interconnect structure having a second surface attached to the phase change material element, a second surface area of the second surface being substantially smaller than a first surface area of the first surface, the conductive interconnect structure being formed from outer edges of a conductive trench; and a substantially planar second conductor formed adjacent to the phase change material element.

2. The electronic memory structure of claim 1, wherein the phase change material element comprises a phase change surface physically connected to the interconnection layer having a phase change surface area, a minority amount of the phase change surface area being physically connected to the conductive interconnect structure.

3. The electronic memory structure of claim 1, wherein a minority amount of the second surface of the interconnect structure is physically connected to the phase change surface area.

4. The electronic memory structure of claim 1, wherein substantially all of the first surface of the interconnect structure is physically connected to the first conductor.

5. The electronic memory structure of claim 1, further comprising a plurality of phase change elements commonly located between the interconnect layer and the second conductor.

6. The electronic memory structure of claim 5, further comprising an insulator material between the phase change elements.

7. The electronic memory structure of claim 6, wherein the insulator material comprises a dielectric.

8. The electronic memory structure of claim 1, wherein the first conductor and the second conductors are designated as word lines and bit lines.

9. An electronic memory structure comprising:

a substrate;

a substantially planar first conductor formed adjacent to the substrate;

an interconnection layer formed adjacent to the first conductor; a phase change material element formed adjacent to the interconnection layer; the interconnection layer comprising:

a conductive interconnect structure extending from the first conductor to the phase change material element, the interconnect structure having a first surface physically connected to the first conductor, the interconnect structure having a second surface attached to the phase change material element, the conductive interconnect structure being formed from outer edges of a conductive trench;

the phase change material element comprising a phase change surface physically connected to the interconnection layer, the phase change surface having a phase change surface area, a minority amount of the phase change surface area being physically connected to the conductive interconnect structure; and a substantially planar second conductor formed adjacent to the phase change material element.

10. The electronic memory structure of claim 9, further comprising a plurality of phase change elements commonly located between the interconnect layer and the second conductor.

11. The electronic memory structure of claim 10, further comprising an insulator material between the phase change elements.

12. The electronic memory structure of claim 11, wherein the insulator material comprises a dielectric.

13. The electronic memory structure of claim 9, wherein the first conductor and the second conductors are designated as word lines and bit lines.

14. A computing system comprising:

a processing unit;

a RAM memory structure that the processing unit can store and access information, the RAM memory structure comprising;

a substrate;

a substantially planar first conductor formed adjacent to the substrate;

an interconnection layer formed adjacent to the first conductor;

a phase change material element formed adjacent to the interconnection layer;

the interconnection layer comprising;

a conductive interconnect structure extending from the first conductor to the phase change material element, the interconnect structure having a first surface physically connected to the first conductor, the interconnect structure having a second surface attached to the phase change material element, a second surface area of the second surface being substantially smaller than a first surface area of the first surface, the conductive interconnect structure being formed from outer edges of a conductive trench; and a substantially planar second conductor formed adjacent to the phase change material element.

* * * * *